US011170838B2

(12) United States Patent
Bayat et al.

(10) Patent No.: US 11,170,838 B2
(45) Date of Patent: Nov. 9, 2021

(54) TEMPERATURE EFFECT COMPENSATION IN MEMORY ARRAYS

(71) Applicant: MENTIUM TECHNOLOGIES INC., Santa Barbara, CA (US)

(72) Inventors: Farnood Merrikh Bayat, Santa Barbara, CA (US); Jaroslaw Sulima, Santa Barbara, CA (US); Mirko Prezioso, Santa Barbara, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 0 days.

(21) Appl. No.: 16/932,239

(22) Filed: Jul. 17, 2020

(65) Prior Publication Data

US 2021/0020232 A1   Jan. 21, 2021

Related U.S. Application Data

(60) Provisional application No. 62/875,066, filed on Jul. 17, 2019.

(51) Int. Cl.
*G11C 11/40* (2006.01)
*G11C 11/406* (2006.01)
(Continued)

(52) U.S. Cl.
CPC .... *G11C 11/40626* (2013.01); *G01R 19/0038* (2013.01); *G01R 19/10* (2013.01);
(Continued)

(58) Field of Classification Search
CPC ............ G11C 11/4094; G11C 11/4097; G11C 7/1096; G11C 11/4074; G11C 5/025;
(Continued)

(56) References Cited

U.S. PATENT DOCUMENTS 6,687,165 B1   2/2004  Cioaca
6,813,194 B2   11/2004 Tran et al.
(Continued)

OTHER PUBLICATIONS

PCT International Search Report and Written Opinion issued in corresponding Application No. PCT/US2020/042666, dated Nov. 20, 2020.

(Continued)

*Primary Examiner* — Ajay Ojha
(74) *Attorney, Agent, or Firm* — Maschoff Brennan

(57) ABSTRACT

A memory system having a temperature effect compensation mechanism is provided. The memory system may include a plurality of memory cells, where the memory cells are organized in an array having two or more rows of memory cells arranged horizontally and two or more columns of memory cells arranged vertically. The plurality of memory cells may have an operating temperature range. The memory system may also include a temperature-dependent biasing circuit that is configured to reduce a biasing voltage to the plurality of memory cells when the temperature of the array is at or near an upper end of the operating temperature range and increase the biasing voltage to the plurality of memory cells when the temperature of the array is at or near a lower end of the operating temperature range.

19 Claims, 10 Drawing Sheets

(51) Int. Cl.
- *G11C 11/4074* (2006.01)
- *G11C 5/02* (2006.01)
- *G11C 11/4091* (2006.01)
- *G11C 11/4093* (2006.01)
- *G01R 19/00* (2006.01)
- *G01R 19/10* (2006.01)
- *G05F 1/56* (2006.01)
- *G05F 1/575* (2006.01)
- *G11C 7/10* (2006.01)
- *G11C 11/4094* (2006.01)
- *G11C 11/4097* (2006.01)
- *H03K 17/22* (2006.01)

(52) U.S. Cl.
CPC .............. *G05F 1/561* (2013.01); *G05F 1/575* (2013.01); *G11C 5/025* (2013.01); *G11C 7/1096* (2013.01); *G11C 11/4074* (2013.01); *G11C 11/4091* (2013.01); *G11C 11/4093* (2013.01); *G11C 11/4094* (2013.01); *G11C 11/4097* (2013.01); *H03K 17/22* (2013.01)

(58) Field of Classification Search
CPC ... G11C 11/4091; G11C 11/4093; G11C 7/16; G11C 2216/04; G11C 16/3418; G11C 16/30; G11C 16/08; G11C 8/08; G11C 5/147; G11C 7/04; H03K 17/22; G01R 19/0038; G01R 19/10; G05F 1/561; G05F 1/575
See application file for complete search history.

(56) References Cited

U.S. PATENT DOCUMENTS

| | | |
|---|---|---|
| 8,547,746 B2 * | 10/2013 | Tanzawa ............ G11C 16/0483 365/185.18 |
| 8,547,756 B2 | 10/2013 | Widjaja et al. |
| 9,419,596 B2 | 8/2016 | Yang et al. |
| 2006/0119496 A1 | 6/2006 | Tester et al. |
| 2010/0158055 A1 | 6/2010 | Giebel |
| 2019/0115077 A1 | 4/2019 | Shin et al. |

OTHER PUBLICATIONS

Non-Final Office Action issued in corresponding U.S. Appl. No. 16/932,258, dated Oct. 7, 2020.

* cited by examiner

TEMPERATURE EFFECT COMPENSATION IN MEMORY ARRAYS

CROSS-REFERENCE TO A RELATED APPLICATION

This patent application claims the benefit of U.S. Provisional Application No. 62/875,066 filed Jul. 17, 2019, which is incorporated herein by reference.

BACKGROUND

Memory systems including an array of memory devices may be used in a variety of applications ranging from data storage to in-memory computation. In these systems, a single device or a collection of devices and circuits may define a single cell which may be connected together to form an array. Based on the properties of these memory cells, the memory may be used to store a data in a volatile or non-volatile form. Memory arrays like SRAM uses memory cells implemented with regular CMOS transistors and belong to the category of volatile memory. Non-volatile memory devices like resistive-RAMs, PCM, flash, etc may be used as a memory cell to implement a non-volatile memory array. Each memory cell may be configured to store a single or multiple bits of information and may be read from or written to multiple times using the peripheral circuitries designed and located around the memory array. The array of memory cells may also be used for applications other than storage like in-memory computation where array of memory cells may be used to perform mathematical operations such as dot-product or vector-by-matrix multiplication using the data stored in memory cells. In such applications, the memory module may include some extra circuits like Analog-to-Digital Converter (ADC), Digital-to-Analog Converter (DAC), sense amplifier, current-to-voltage converter, etc. The memory array with NVM memory cells may include circuitries to generate and route high-voltage signals needed to program the NVM cells.

Arrays of memory devices as well as the peripheral circuits included in the memory system are often temperature sensitive meaning that the behavior of the system during reading data from the memory or writing data to the memory changes by the temperature. For memory arrays used for in-memory computation, changes in temperature may result in a change in the results of computation. This sensitivity of the memory system to temperature may affect and degrade the speed, precision of operation, power consumption and performance of the system. This happens mainly because the channel currents of the CMOS transistors in subthreshold, linear (triode) and saturation may change significantly from temperature to temperature. While linear or saturation operation points has less sensitivity to temperature, subthreshold operation regime is very sensitive to temperature. Using output circuitries like sense amplifiers, ADCs, etc. to compensate the temperature effects may result in a bulky, inefficient memory system with high power consumption. On the other side, compensating temperature effects at the memory cell level may avoid all the aforementioned problems.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

In one embodiment, a memory system having a temperature effect compensation mechanism is provided. The memory system may include a plurality of memory cells, the memory cells being organized in an array having two or more rows of memory cells arranged horizontally and two or more columns of memory cells arranged vertically. The plurality of memory cells may have an operating temperature range. The memory system may also include a temperature-dependent biasing circuit, the temperature-dependent biasing circuit that is configured to reduce a biasing voltage to the plurality of memory cells when the temperature of the array is at or near an upper end of the operating temperature range and increase the biasing voltage to the plurality of memory cells when the temperature of the array is at or near a lower end of the operating temperature range.

In some embodiments, each row of memory cells within the array may have a separate temperature-dependent biasing circuit that controls the biasing voltage for each memory cell within the row.

In some embodiments, the memory system may be used for in-memory applications and analog inputs are applied directly to the temperature-dependent biasing circuit.

In some embodiments, each of the two or more rows of memory cells may include a first gate and a second gate. Digital inputs may be applied to the first gate and inputs from the temperature-dependent biasing circuit may be applied to the second gate.

In some embodiments, each of the two or more rows of memory cells may include a first gate and a second gate. The first gate may used for row selection and the second gate may be used for both digital inputs and inputs from the temperature-dependent biasing circuit.

In some embodiments, the temperature-dependent biasing circuit controls the biasing voltage for memory cells in a plurality of rows within the array.

In some embodiments, each row of the two or more rows of memory cells may include an extra input configured to turn on and off the memory cells during either a read or write operation. In other embodiments, analog or digital inputs may be applied to the extra input.

In some embodiments, the temperature-dependent biasing circuit may convert an analog input current to a temperature-dependent voltage that is used to bias the memory cells within the array.

In some embodiments, the memory cells may convert the biasing voltage to a current based on an amplitude of the biasing voltage.

In some embodiments, the temperature-dependent biasing circuit may be a diode connected flash or floating-gate transistor.

In some embodiments, the temperature-dependent biasing circuit may include a buffer configured to increase the driving capability of the biasing circuit.

In some embodiments, the memory cells may be programmable with analog (multi-bit) or digital values.

In some embodiments, the memory cells may be flash or floating-gate transistors.

In some embodiments, the memory cells may include a supercell structure having shared sources and erase gates.

In some embodiments, the memory cells may be configured to be biased to operate at different operating regimes including subthreshold, saturation, or triode (linear).

In another embodiment, a memory system having a temperature effect compensation mechanism is provided. The system may include a plurality of memory cells that are organized in an array having a first row of two or more electrically coupled memory cells arranged horizontally and a second row of two or more electrically coupled memory cells arranged horizontally. The system may also include a first temperature-dependent biasing circuit having a first I-V curve that is configured to sense a temperature of the memory cells in the first row and a second temperature-dependent biasing circuit having a second I-V curve that is configured to sense a temperature of the memory cells in the second row. The first temperature-dependent biasing circuit may be configured to change a biasing voltage applied to the first row of memory cells based on a temperature of the memory cells in the first row and the second temperature-dependent biasing circuit may be configured to change a biasing voltage applied to the second row of memory cells based on a temperature of the memory cells in the second row.

In some embodiments, the plurality of memory cells may have an operating temperature range. The first temperature-dependent biasing circuit may be configured to reduce the biasing voltage applied to the first row of memory cells when the temperature of the memory cells in the first row is at or near an upper end of the operating temperature range and increase the biasing voltage applied to the first row of memory cells when the temperature of the memory cells in the first row is at or near a lower end of the operating temperature range, and the second temperature-dependent biasing circuit may be configured to reduce the biasing voltage applied to the second row of memory cells when the temperature of the memory cells in the second row is at or near an upper end of the operating temperature range and increase the biasing voltage applied to the second row of memory cells when the temperature of the memory cells in the second row is at or near a lower end of the operating temperature range.

The object and advantages of the embodiments will be realized and achieved at least by the elements, features, and combinations particularly pointed out in the claims. Both the foregoing summary and the following detailed description are exemplary and explanatory and are not restrictive of the invention as claimed.

BRIEF DESCRIPTION OF THE DRAWINGS

Example embodiments will be described and explained with additional specificity and detail through the use of the accompanying drawings in which.

DETAILED DESCRIPTION

Figure 1:
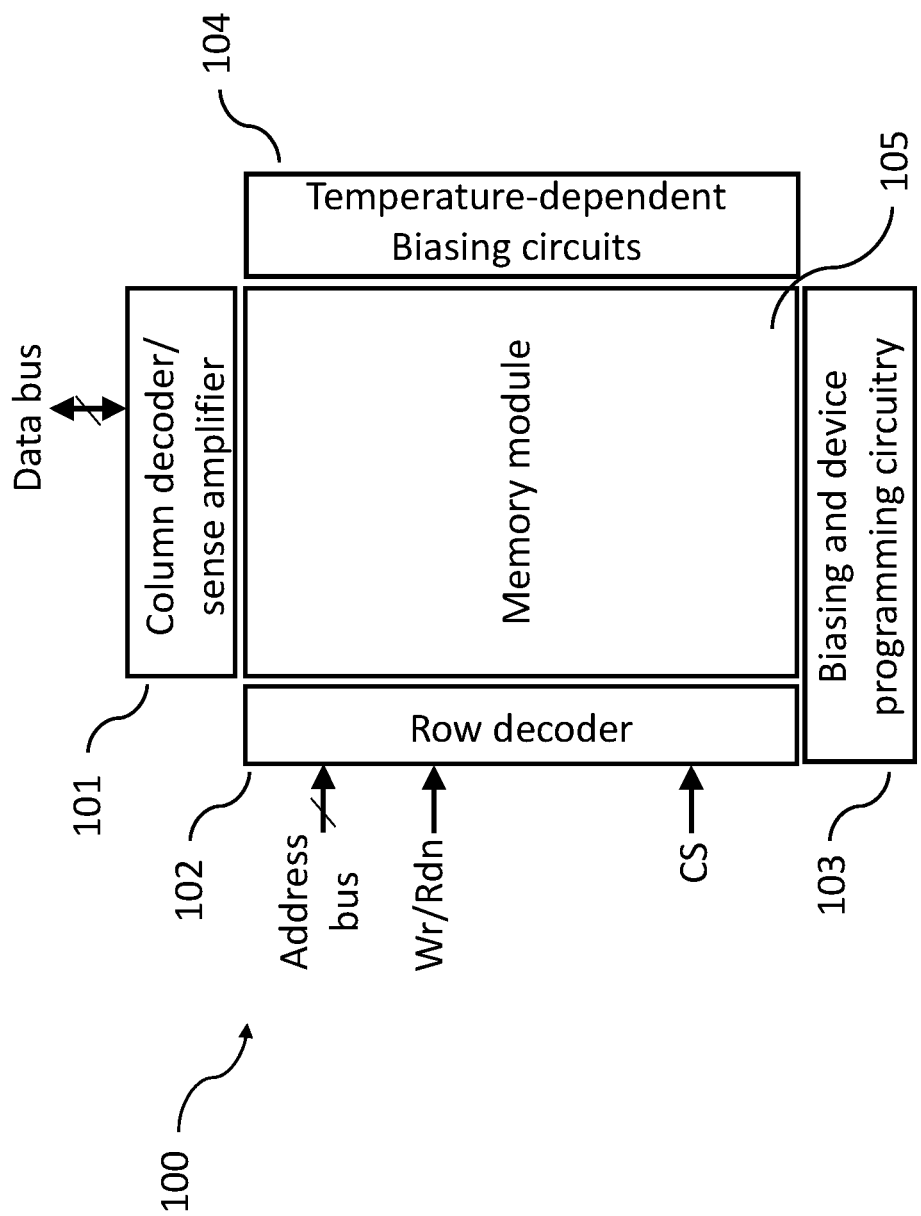
FIG. 1 illustrates an example of a memory system for data storage application.

One or more embodiments of the present disclosure may include a memory system including a matrix or array of volatile or non-volatile memory cells. The memory system may include some peripheral circuitries including but not limited to row and column decoders, sense amplifier, ADC, DAC, current to voltage converter, programming circuitry, biasing circuitry, charge pump, pulse generator, high-voltage and low-voltage routing circuitry, etc. The memory system may be configured to be used for data storage or in-memory computing applications. Each single cell or a set of cells may be used in the matrix of memory devices to store digital or analog (multibit) values. Writing to a single memory cell or a set of memory cells in parallel may be performed using a low-voltage and high-voltage peripheral circuitries like how it is done in regular memory arrays. In operation or read phase, the memory array may produce outputs proportional to the given inputs and the data stored in memory cells. In memory applications, inputs to the memory module may be the address and the read enabling signals while the output may be the contents of the memory cells on the row pointed by the address. For in-memory computation like vector-by-matrix multiplication, the inputs of the module may be the vector of analog or digital inputs and the outputs may be the vector of analog or digital outputs where each output may be proportional to all or a subset of input vector and the content of memory cells electrically coupled to that output.

In some embodiments, the memory system may include a temperature-dependent biasing circuit which may bias the memory cells during read or write operation to reduce or remove their sensitivity to temperature. The temperature-dependent biasing circuits may lower the biasing voltage in higher temperatures so the memory cells may produce a current similar or identical to the current they may produce at lower temperatures. The temperature-dependent biasing circuits may increase the biasing voltage in lower temperatures so the memory cells may produce a current similar or identical to the current they may produce at higher temperatures. In some embodiments, there may be one temperature-dependent biasing circuit per each row of the memory array. In some other embodiments, the temperature-dependent biasing circuit may be shared between multiple rows or all the rows of the memory array. Some embodiments may be configured so that the memory cells may accept two or more inputs. In these embodiments, one input may be connected to the temperature-dependent biasing circuit to minimize temperature impacts and the other input may be used to turn on or off the memory cell during read and write operation. For in-memory applications, each row may have its own temperature-dependent biasing circuit and analog inputs may be applied directly to the temperature-dependent biasing circuit. The temperature-dependent biasing circuits may convert these analog currents to voltages which may later be converted back to current with the memory cells inside the memory array. The current produced by the memory cells may be proportional to the amplitude of the analog input current and the state of that memory cell. In some embodiments, pairs of memory cells may share a common source lines forming a supercell configuration to reduce layout area of the memory array.

In some embodiments, the system may include a matrix of memory cells arranged in rows and columns. Each memory cell may be a single device or element like a transistor or may consist of multiple circuit elements. There may be a programming peripheral circuitry like charge pump, pulse generator, row and column decoders, etc. next to the memory system allowing individual or parallel programming of memory cells. Each memory cell may be used to store digital or analog values and may operate in subthreshold, linear or saturation regime. The memory system may also include a row and column decoder to address a single or multiple devices within the memory array for reading or writing purpose. The same or different decoders may be used to route input vector to proper rows of the memory array and route the proper memory array outputs/columns to output vectors.

In some embodiments, the memory cells may include a non-volatile device like a flash transistor, floating-gate transistor, Sonos transistor, resistive RAM, PCM, etc. In some other embodiments, the memory cell may only include volatile or non-programmable elements like NMOS and PMOS transistors.

In some embodiments, the memory devices may have four (e.g. Gate, Drain, Source and substrate), or five (e.g. Gate, Drain, Source, Erase Gate, Substrate), or six (e.g. Gate, Control Gate, Drain, Source, Erase Gate, Substrate) terminals.

The memory system may be used for data storage application. The row decoder may select a row of a memory array based on a given address. The column decoder may select a single or multiple of memory cells on the selected row. In a write phase, the low-voltage and high-voltage programming circuitries, charge pump, etc. may be used to program the selected devices with digital or analog (multibit) values following a device programming procedure/scheme. In a read phase, the selected devices may produce a current proportional to their programmed states. These currents may be routed to the Analog-to-Digital Converter (ADC) or a sense amplifier to be converted to the digital representation of the data stored in the selected memory devices. Based on the type of devices used in memory cells, there may be a need for a biasing circuitry to bias different terminals of the selected and unselected devices with different voltages. Different set of voltages may be used to bias the selected and unselected devices within the memory array during the read and write operations. The current generated by the selected devices during the read or write phase may depend on temperature. The amount of dependency of these currents to temperature may depend on their characteristics, biasing condition and operating region.

In some other embodiments, the memory system may be used for in-memory computing or similar applications. The row and column decoders may respectively select a set of rows and columns of the memory array to be involved in in-memory computation. In an operation phase, a set of digital or analog input signals may be applied to the selected rows. Devices selected by the row and column decoders receiving input signals may produce a current proportional to their programmed states and the input signal they are electrically coupled to. These currents may be summed up on the columns of the memory array and may be routed to the Analog-to-Digital Converter (ADC), Current-to-voltage converter or a sense amplifier to be converted to digital or some other analog representations. Based on the type of devices used in memory cells, there may be a need for a biasing circuitry to bias different terminals of the selected and unselected devices with different voltages. Different sets of voltages may be used to bias the selected and unselected devices within the memory array during the read and write operations. The current generated by the selected devices during the read or write phase may depend on temperature. The amount of dependency of these currents to temperature may depend on their characteristics, biasing condition and operating region.

A memory array using non-volatile memory devices may be programmed by first selecting a single or multiple devices using the row and column decoders and then applying a sequence of programming and/or erasure pulses until the states of the selected devices reach predetermined states at specific read condition. Amplitude and pulse width of the programming and erasure pulses may depend on device characteristics. Terminals of the selected and unselected devices within the memory array may need to be biased with proper voltages for proper operation.

Unselected devices within the memory array may be biased with specific voltages to prevent them from generating current during the read operation or to get programmed during the write operation performed on selected devices.

In some embodiments, pairs of memory devices may form a supercell structure where they share their source terminals to reduce layout area of the memory array.

In some embodiments, there may be a temperature-dependent biasing circuit generating a biasing voltage which may vary by the temperature. The circuit may generate lower voltages or currents in higher temperatures and higher voltages or currents in lower temperatures. The circuit may include devices like regular or flash transistors with temperature-dependent characteristics and I-V curves to sense a temperature. At different temperatures, these devices may have different characteristics like generating different currents at the same biasing condition allowing the temperature-dependent biasing circuit to generate a temperature-dependent biases. The operating temperature ranges of the temperature-dependent biasing circuit may be similar to the operating temperature ranges of the temperature-sensitive devices used to construct the temperature-dependent biasing circuit. The temperature-dependent biasing circuit may be used to bias the memory cells within the memory array to reduce or remove their temperature sensitivity. At higher temperatures, the temperature-dependent biasing circuit may bias the memory cells inside the memory array with lower voltage to reduce the current they may generate in that high temperature. The biasing voltage may change by temperature in such a way that the currents generated by memory cells inside the memory array may have a negligible change with temperature.

In some embodiments, different rows or different set of rows of the memory array may be biased with a separate temperature-dependent biasing circuit.

In some other embodiments, the temperature-dependent biasing circuit may be used to convert the analog input current to a temperature-dependent voltage which may be used to bias the memory cells within the memory array. The memory cells may convert the biasing voltage back to current based on the amplitude of the biasing voltage and the state they have been programmed to. Usage of temperature-dependent biasing circuits to drive the memory array may reduce or remove the temperature sensitivity of the computations like in-memory computations performed in the memory array.

The temperature-dependent biasing circuit may include but not limited to a simple diode-connected regular CMOS or flash transistor converting input current to voltage. The temperature-dependent biasing circuit may use a memory device similar to the memory cells used in the memory array to deliver better temperature insensitivity to memory array. The biasing conditions of the temperature-dependent biasing circuit may be selected to be as close as possible to the biasing conditions of the memory cells within the memory array to minimize the mismatch and to reach a temperature independent design.

In some embodiments, the temperature-dependent biasing circuit may also include a programming circuit to program the devices to states similar to states where memory cells may be programmed to.

These and other embodiments of the present disclosure will be explained with reference to the accompanying figures. In the figures, features with like numbers indicate like structure and function unless described otherwise.

FIG. 1 illustrates an example of a memory system 100 with temperature-dependent biasing circuits 104. Like regular memory architectures, the memory system may include a row decoder 102 and a column decoder 101, low- and high-voltage biasing and device programming circuits 103, and an array of memory devices or cells 105. The memory cells may be accesses for a read or write operation using memory interface signals like data and address buses, Wr/Rdn, and Chip Select (CS). The address bus may select a set of devices on a specific row of the memory array to be read or written to. Read or write operation may be selected using the Wr/Rdn signal. During the read operation, data may be delivered on the data bus while during the write operation, data bus may send the data to the memory. The memory system may include a programming circuit and mechanism to program a single or a set of memory cells with the given data. Each memory cell may be used to store digital or analog (multibit) data. The memory system may be used for data storage and retrieval applications. Memory devices within the memory array 105 may be of any type (flash or regular transistor, resistive RAM, PCM, etc.) and may be biased and operate in different operating regions like subthreshold, linear (triode) or saturation. Different biasing conditions may be used for memory devices when the memory array is in read, write or idle phase.

In some embodiments, the memory system 100 may also include a temperature-dependent biasing circuit or module 104. The temperature-dependent biasing circuit 104 may generate biasing voltages or currents which may vary by temperature. The generated biasing voltages or currents may be used to bias the memory devices or cells within the memory array 105 to reduce or remove their sensitivity to temperature variations. In some other embodiments, the temperature-dependent biasing circuits 104 may be implemented by the same memory cells or devices as those used in memory array to have similar temperature dependency which may help reducing the dependency of memory array 105 to temperature. Reducing the temperature dependency of the memory array 105 may increase the speed and the operating temperature range of the memory system 100 while reducing the power consumption and chip area.

Figure 2:
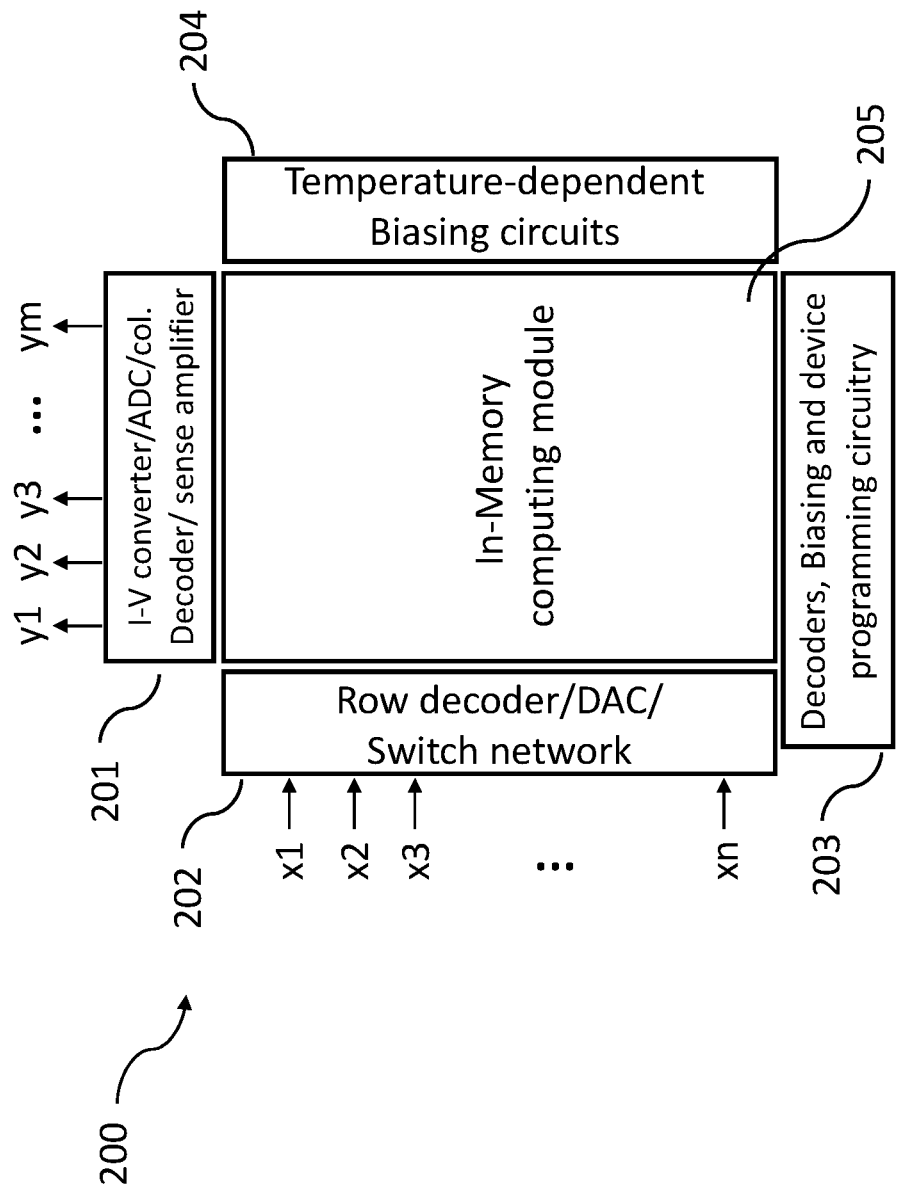
FIG. 2 illustrates an example of a memory system for in-memory computing application.

FIG. 2 illustrates an example of a memory system 200 having an array of memory devices 205 used for in-memory computation. Similar to memory systems used for data storage application shown in FIG. 1, the memory system of FIG. 2 may include decoders, biasing and programming circuits 203, a row decoder/DAC/switch network 202 and an I-V converter/ADC/column decoder/sense amplifier 201, through which a single or a set of devices within the memory array 205 may be selected for a read or a write operation. Memory devices within the memory array 205 may be programmed with digital or analog (multibit) value and may produce a current proportional to their programmed state when activated. Memory devices within the memory array 205 may be of any type (flash or regular transistor, resistive RAM, PCM, etc.) and may be biased and operate in different operating regions like subthreshold, linear (triode) or saturation. Different biasing conditions may be used for memory devices when the memory array 205 is in read, write or idle phase.

In some embodiments, the memory array 205 may be used for in-memory computation. A vector of analog or digital input signals [x1, x2, . . . , xn] may be applied to the selected rows of the memory array using the low- and/or high-voltage row decoder/DAC/switch network 202. The row decoder/DAC/switch network 202 may also include a Digital-to-Analog Converter (DAC) to convert the digital inputs to their corresponding analog representation (i.e. analog current or voltage signal) before being applied to the memory array 205. Each memory device may receive a digital or an analog signal and may produce a current with an amplitude proportional to the amplitude of the received signal, the state it is programmed to and the condition it is biased to. The currents generated by selected memory devices may be added together column-wise controlled by the I-V converter/ADC/column decoder/sense amplifier 201. The I-V converter/ADC/column decoder/sense amplifier 201 may also include Analog-to-Digital Converters (ADC), current-to-voltage converter, or sense amplifier to measure the sum-of-currents output signals and convert them to the required representation (e.g. voltage, digital, etc.). The output vector [y1, y2, . . . , ym] may be result of the computation performed in the memory array.

In some embodiments, the memory system 200 of FIG. 2 may be used to perform in-memory computations like vector by matrix multiplication, matrix by matrix multiplication or vector by vector dot product multiplication. In some other embodiments, the memory system 200 of FIG. 2 may be used for analog data storage and retrieval.

In some embodiments, proper biasing voltages or currents may be applied to unselected devices within the memory array 205 to prevent them from producing currents during the operation phase or being programmed during the programming phase.

In some embodiments, the memory system 200 of FIG. 2 may be configured to also include a temperature-dependent biasing circuit 204 which may be used to bias the selected or unselected memory cells in the memory array 205 during read and/or write operation. The biasing condition generated by the temperature-dependent biasing circuit 204 may be such a way that it may reduce or remove the dependency of the current generated by memory cells to temperature. The temperature-dependent biasing circuit 204 may be the sole biasing circuit of memory cells or may be used in conjunction with other circuits to bias memory cells. If at higher temperatures the memory cell produces higher currents when activated, the temperature-dependent biasing circuit may generate lower biasing voltage to reduce the memory cell's current. The process may be reversed at lower temperatures.

In some other embodiments, the vector of analog or digital input signals may be applied to the temperature-dependent biasing circuits 204 rather than the memory array 205. In these embodiments, the temperature-dependent biasing circuit may convert input signals to a biasing voltage with an amplitude proportional to the amplitude of the input signal which may then be used to bias the memory cells in the memory array 205.

To minimize the dependency of memory cells within the memory array 205 to temperature during the read and write operation, the behavior (e.g. devices specs, channel width and length, device type) and the biasing condition of the temperature-dependent biasing circuit 204 may be kept as similar as possible to the behavior and biasing conditions of the memory cells within the array 205 to minimize the mismatch between the two devices or circuits.

In some embodiments, where memory cells used to create the memory array 105 (FIG. 1) or 205 (FIG. 2) has more than one control gate, one gate may be used as a switch to turn on or off the memory cell while the other one may be used to bias the memory cell with the voltage generated by the temperature-dependent biasing circuit 104 (FIG. 1) or 204 (FIG. 2). The gates used for biasing and for switching may be interchangeable.

In some embodiments where memory cells are floating gate or flash transistors with two control gates (e.g. word-line and control-gate), the biasing voltage generated by the temperature-dependent biasing circuit may be applied to the gate which has the most overlap with the floating gate storing the charge and has the most impact on the current generated by the cell. In other embodiments, the gate receiving the biasing voltage from the temperature-dependent biasing circuit may be the one closest to the source terminal.

Figure 3:
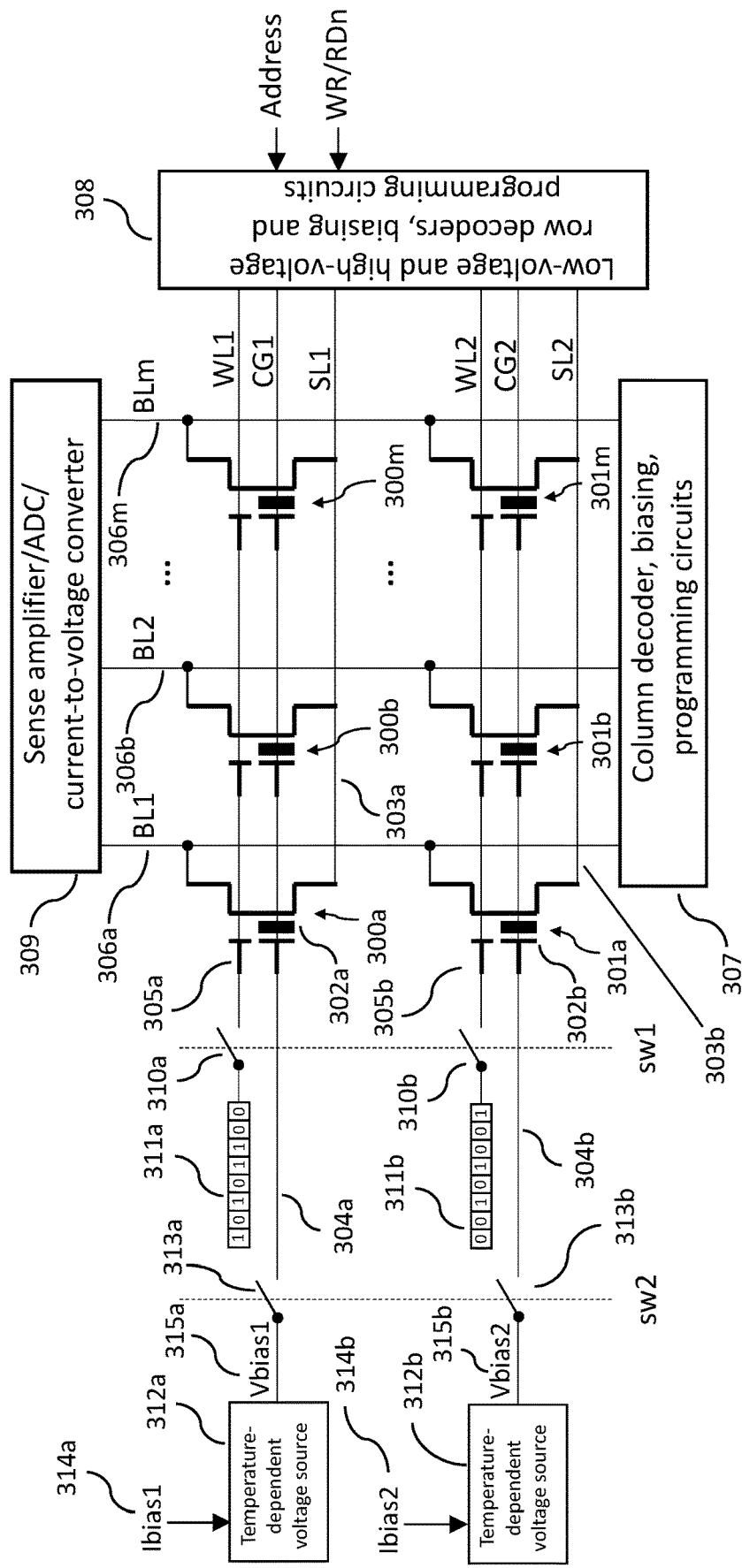
FIG. 3 illustrates an example of a memory system with individual temperature-dependent biasing circuit per each row.

FIG. 3 illustrates an example of an array of non-volatile memory devices which may be used for memory storage and retrieval or in-memory computing application. The memory array may include flash or floating-gate memory devices 300a, 300b ... 300m and memory devices 301a, 301b ... 300m arranged in rows and columns forming a matrix or array of memory devices. For example, as shown in FIG. 3, memory devices 300a, 300b ... 300m are in a first row and memory devices 301a, 301b ... 301m are in a second row. Each memory device may have multiple terminals including source-lines (SLs), main gates (WLs), control gates (CGs), erase gates, inaccessible floating-gates, and a drain or bit-lines (BLs). With regard to the configuration shown in FIG. 3, memory devices 300a, 300b ... 300m have terminals including a source-line 303a (also labeled SL1), a main gate 305a (also labeled WL1), an erase gate (not shown), and an inaccessible floating-gate 302a. Memory devices 301a, 301b ... 301m have terminals including a source-line 303b (also labeled SL2), a main gate 305b (also labeled WL2), an erase gate (not shown), and an inaccessible floating-gate 302b. Memory devices 300a and 301a include a drain or bitline 306a (also labeled BL1). Memory devices 300b and 301b include a drain or bitline 306b (also labeled BL2). Memory devices 300m and 301m include a drain or bitline 306m (also labeled BLm).

Main gates, source-lines, control gates, and erase gates of devices located on the same row of the memory array may be electrically coupled to each other. For example, main gates 305a of memory devices 300a, 300b ... 300m may be electrically coupled to each other since these memory devices are in the same row, while main gates 305b of memory devices 301a, 301b ... 301m may be electrically coupled to each other since these memory devices are in the same row. Similarly, source-line 303a of memory devices 300a, 300b ... 300m may be electrically coupled to each other since these memory devices are in the same row, while source-line 303b of memory devices 301a, 301b ... 301m may be electrically coupled to each other since these memory devices are in the same row. In addition, control gate 304a of memory devices 300a, 300b ... 300m may be electrically coupled to each other since these memory devices are in the same row, while control gate 304b of memory devices 301a, 301b ... 301m may be electrically coupled to each other since these memory devices are in the same row. Drains of memory devices located on the same columns of the memory array may be electrically coupled together forming bitlines. For example, memory devices 300a and 301a share a bitline 306a (also labeled BL1) since these memory devices are in the same column. Similarly, memory devices 300b and 301b share a bitline 306b (also labeled BL2) since these memory devices are in the same column. In addition, memory devices 300m and 301m share a bitline 306m (also labeled BLm) since these memory devices are in the same column. There may be no restriction on the number of rows or columns of the memory array.

The memory system of FIG. 3 may include peripheral column circuitries 307 and peripheral row circuitries 308. Peripheral column circuitries 307 may include a low- and/or high-voltage column decoder and peripheral row circuitries 308 may include a low- and/or high-voltage row decoder, which may be used to select a single or a set of devices within the memory array for read, write or computing operation. Peripheral column and row circuitries 307 and 308 may also include biasing and programming peripheral circuits, which may be used to properly bias different terminals of selected and unselected memory devices during read, write, operation phases and generate necessary programming and erasure pulses to program or erase flash transistors. Erasure or programming of flash transistors in the memory array may be performed one at a time or in parallel. Each memory device 300a, b ... m and 301a, b ... m may be used to store a digital (binary) or analog (multibit) value.

In some embodiments, control gates 304a of memory devices 300a, b ... m may be biased during read or write operations with a voltage bias 315a (also labeled Vbias1) generated by a voltage-dependent biasing circuit 312a, which is connected to that row. Similarly, control gates 304b of memory devices 301a, b ... m may be biased during read or write operations with a voltage bias 315b (also labeled Vbias2) generated by a voltage-dependent biasing circuit 312b, which is connected to that row. All voltage-dependent biasing circuits may be electrically coupled to their corresponding control gate lines by closing SW2 switches 313a and 313b. SW2 switches 313a and 313b may allow the memory array to be disconnected from the voltage-dependent biasing circuits 312a and 312b and the control gates 304a and 304b of memory devices 300 and 301 to be biased with other biases generated by peripheral row circuitry 308.

The voltage-dependent biasing circuit 312a may be configured to receive a fixed input current 314a (also labeled Ibias1) and convert it linearly or nonlinearly to voltage 315a (Vbias1). Similarly, the voltage-dependent biasing circuit 312b may be configured to receive a fixed input current 314b (also labeled Ibias2) and convert it linearly or nonlinearly to voltage 315b (Vbias2). In some embodiments, the fixed input current 314a (Ibias1) applied to voltage-dependent biasing circuit 312a may be the same as or different than (but similar to) the fixed input current 314b (Ibias2) applied to voltage-dependent biasing circuit 312b. The difference between Vbias1 and Vbias2 may be compensated when memory devices 300 and 301 are being programmed using the same Vbias voltages.

With an increase in temperature, the voltage-dependent biasing circuits 312a and 312b may convert the fixed input currents 314a and 314b to slightly lower Vbias voltages. Lowering the voltage on control gates 304a and 304b of the memory devices 300 and 301 may reduce the current they may generate at that particular temperature when their main gates 305a and 305b are enabled. By designing voltage-dependent biasing circuits 312a and 312b with characteristics and behavior similar to memory devices 300 and 301, the current of memory devices 300 and 301 may remain unchanged at different temperatures.

Memory devices at particular row(s) of the memory array may be selected or enabled to generate currents by enabling their main gates. Applying 0 volts to a main gate corresponding to binary number 0 may prevent the memory device from producing the current it is programmed to generate. Applying a non-zero voltage to a main gate corresponding to binary number 1 may enable the memory device to produce the current it is programmed to generate.

In some embodiments where the memory architecture of FIG. 3 is used for data storage and retrieval applications, switches 310a and 310b (also labeled SW1) may remain off and a particular row of devices may be enabled by setting the main gate of that row to 1 and keeping the main gates of the remaining rows at 0. This may be done by a row decoder within peripheral row circuitry 308.

In some other embodiments where the memory architecture of FIG. 3 is used for in-memory computing applications, main gate voltages may be provided not by the row decoder, but through SW1 switches 310a and 310b. The elements of the vector of analog or digital input signals may directly be applied to the main gates 305a and 305b of the memory array during the operation phase. Each input signal may be applied to one or multiple main gates. When input signals are digital, they may be stored in registers 311a and 311b. These digital inputs stored in registers may be applied to the main gates 305a and 305b of the memory array one bit at a time while control gates 304a and 304b are biased with the voltage-dependent biasing circuits 312a and 312b. When the computations on least significant bits of all input signals are finished, the next least significant bits of digital input signals may be applied together to the main gates. Those memory devices which receive 1 at their main gate may produce current proportional to the voltage applied to their control gate, states they are programmed to and the biasing voltages applied to other terminals. Those memory devices which receive 0 at their main gate may produce zero or near zero current. Rows of the memory array not used in the computation may be deselected by setting their main gates to zero. Data stored in registers may be shifted to the right by one step after the least significant bits are applied to the memory array.

In some embodiments, at each time step, n>1 bits of each digital input signal may be applied to n different rows (main gates) of the memory array to speed up the computation. States to which the memory devices are programmed to in these n different rows of the memory array may be different but proportional to each other. For example, if the weights stored in memory devices located on the first row (out of n) of the memory array to which the leas significant bit is applied be [w1, w2, . . . , wm], the weights stored on the memory devices located on the second row (out of n) to which the next least significant bit is applied may be [2*w1, 2*w2, . . . , 2*wm].

In some embodiments, the memory system of FIG. 3 may be used to implement the computations used in neural networks and deep neural networks like dot product, vector by matrix multiplication and matrix by matrix multiplication. In these applications, network parameters or weights may be stored in memory devices in analog or digital form.

Memory devices located on the same column of the memory array may share the same bitline 306a, b . . . m. Currents generated by these memory devices when enabled may be summed up on the bitlines. Bitlines 306a, b . . . m may be biased by the column decoders and biasing circuits 307 and 309, respectively. The accumulative analog currents on bitlines may be measured and converted into voltage or digital using the current-to-voltage converter, sense amplifiers, or analog to digital converter circuit 309 for further processing. Circuits 307 and 309 may also be used to bias bitlines of unselected devices on the selected row(s) to prevent them from being programmed.

In some embodiments, the amplitude of the fixed input current 314a (Ibias1) may be similar to the amplitudes of currents that memory devices 300a, b . . . m may generate while in read or operation mode. Changes in fixed input current 314a (Ibias1) amplitude may change the sensitivity of memory devices within the memory array to temperature with different amounts depending on the state the memory devices are programmed to. In some other embodiments, the generated voltage 315a (Vbias1) may be such a way that put the memory devices 300a, b . . . m in subthreshold, linear (triode) or saturation region.

In some embodiments, control gates 304 and main gates 305 may be used interchangeably.

In some embodiments, the main gates 305, source-lines 303, control gates 304, erase gates, drains 306 of memory devices 300, 301 within the memory array may be routed horizontally or vertically connecting similar terminals of devices on the same rows or columns together. The routing configuration of terminals of different devices within the memory array may depend on the application of the memory system.

In some embodiments, different type of memory devices with similar or different number of terminals may be used in the architecture of FIG. 3. In other embodiments, a separate transistor may be placed in series with the memory device without control gate to allow the memory array implemented using these memory devices to reach temperature insensitivity. The gate of the added transistor may act as a control gate.

Reducing the sensitivity of the memory array to temperature may keep the range of currents produced on bitlines almost constant at different temperatures which may result in faster, denser and more power efficient memory or in-memory computing module. Using memory devices with longer channels may improve the accuracy of computation by reducing the sensitivity of memory device current to bitline voltage.

Figure 4:
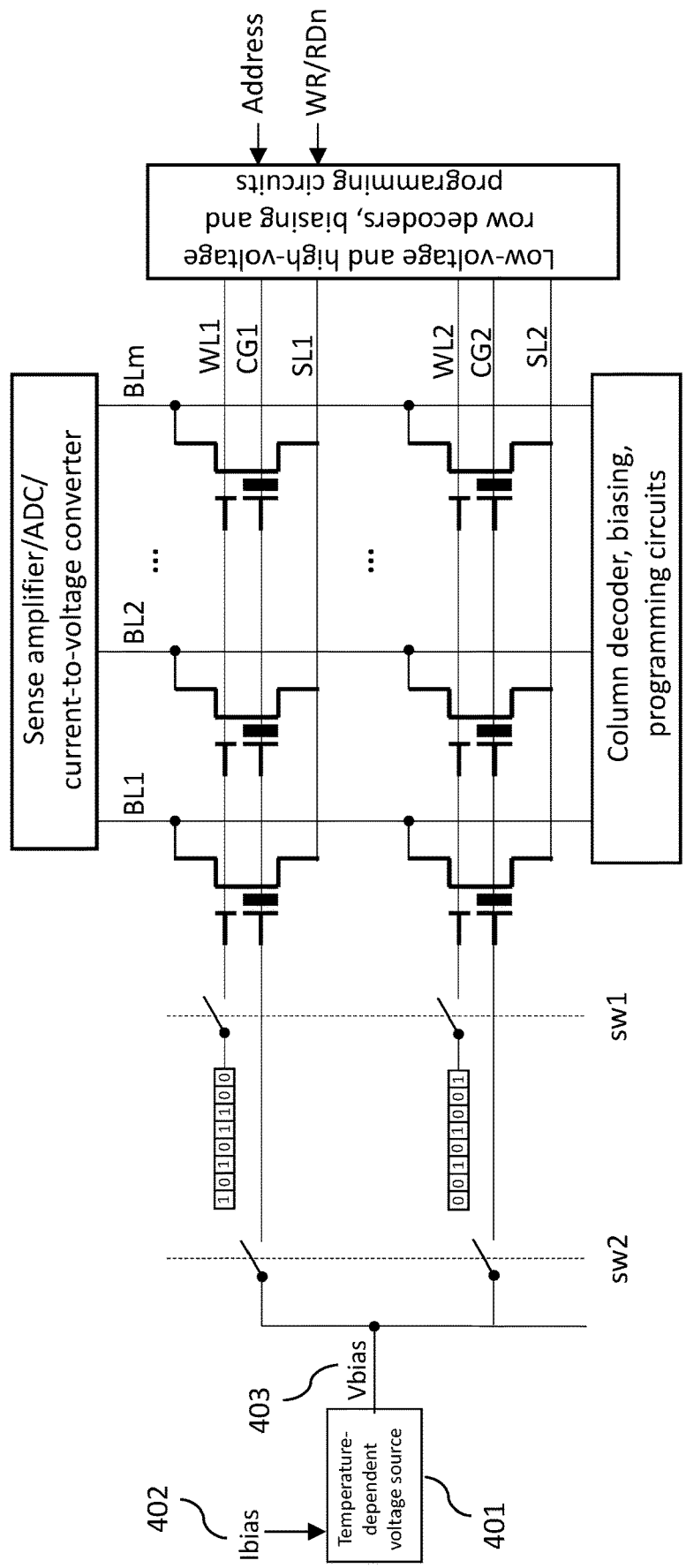
FIG. 4 illustrates an example of a memory system with a temperature-dependent biasing circuit shared between multiple rows.

FIG. 4 illustrates a modified version of the system architecture shown in FIG. 3 where all control gates are biased with a single temperature-dependent biasing circuit. The shared temperature-dependent biasing circuit 401 may receive a single fixed current Ibias 402 and convert it to a voltage Vbias 403. Switches sw2 may be used to apply the generated Vbias to control gates of all selected rows of the memory array. The output of the temperature-dependent biasing circuit may have enough driving capability to be able to promptly charge or discharge the control gate lines of the memory array when needed.

Figure 5:
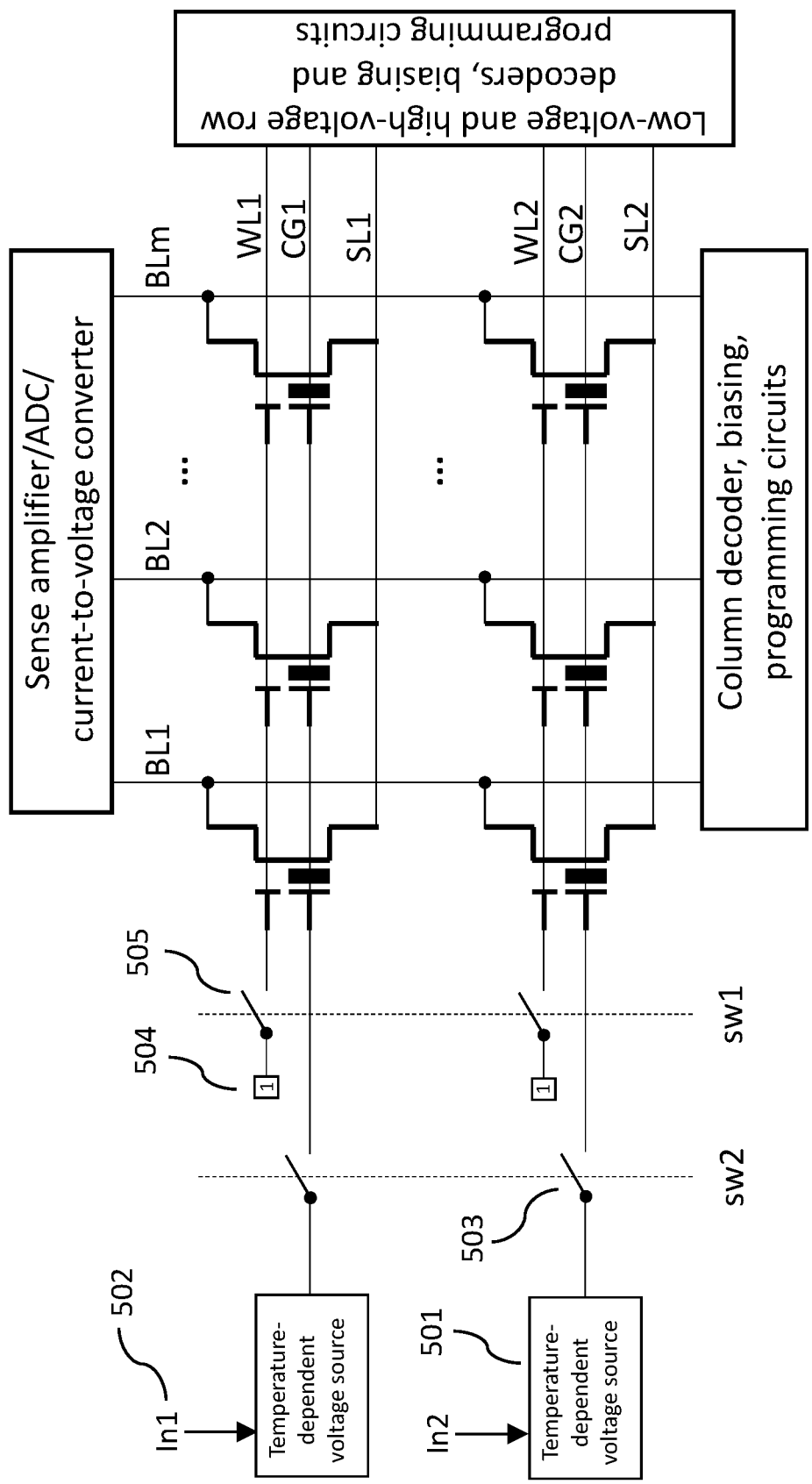
FIG. 5 illustrates an example of a memory system for in-memory computing application with input vectors applied to the temperature-dependent biasing circuits biasing memory cells within the memory array.

FIG. 5 illustrates another modified version of the system architecture shown in FIG. 3 where the memory array is used for in-memory computation and analog input signals are applied to the memory array using the temperature-dependent biasing circuit. Rows of the memory array used for the implementation of the in-memory computation are enabled or selected by setting their main gate to 1 (504) using sw1 switches 505. Temperature-dependent biasing circuits 501 may convert the analog input current signals 502 to voltages used to drive the control gates of selected rows by closing sw2 switches 503. Activated memory devices within the memory array may generate the current on their bitlines proportional to the voltage on their control gates and the state they are programmed to. Applying the analog input signals through the temperature-dependent biasing circuits rather than applying them directly to the array may significantly reduce the sensitivity of the array and the computation performed in it to temperature. Since unlike the architecture of FIG. 3 or FIG. 4, here the voltages biasing control gates are not fixed at any particular temperature and may vary by the change in the input signal, the temperature-dependent biasing circuits 501 may have a high bandwidth and driving capability to deliver the input signals to all memory devices within the memory array with minimum delays.

In some embodiments, the analog input current signals 502 may be replaced by digital signals.

Figure 6:
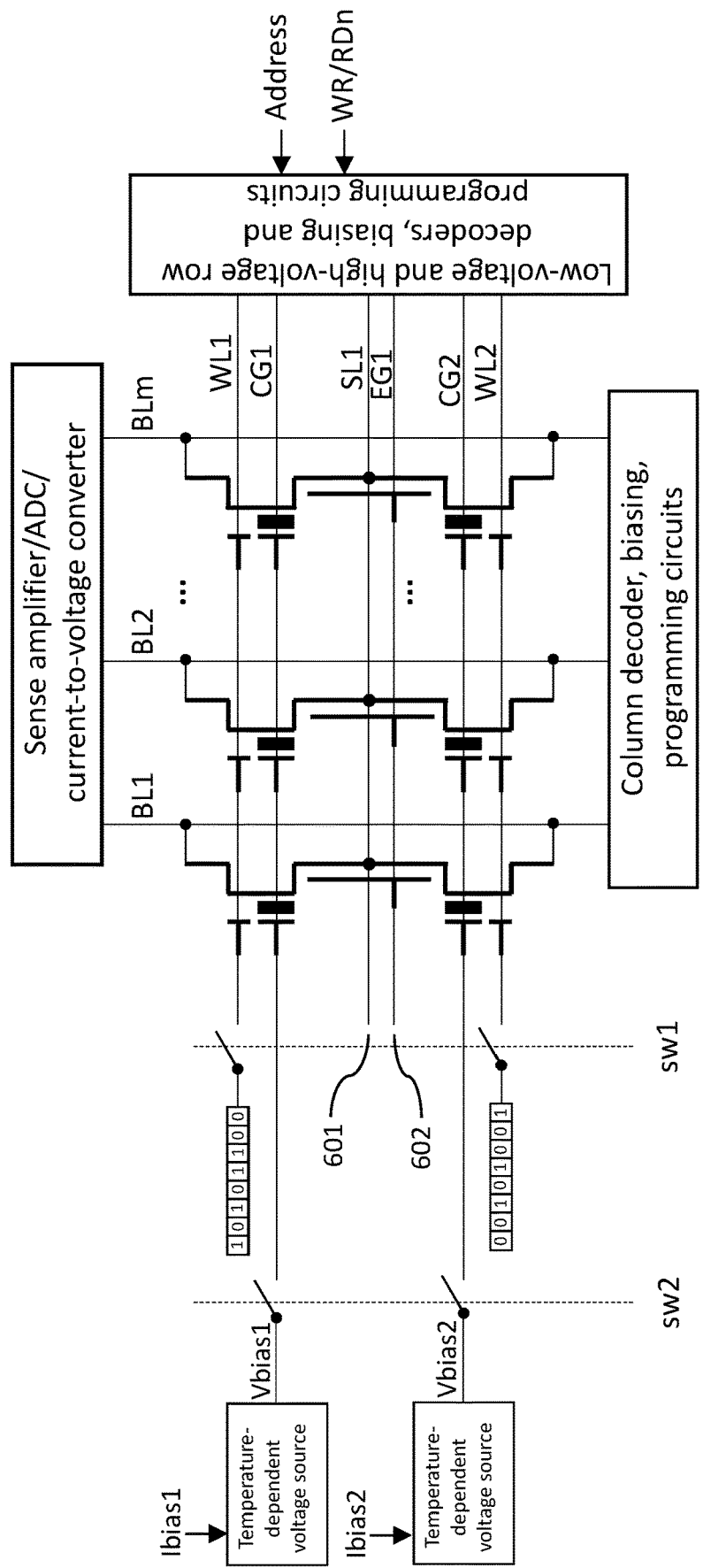
FIG. 6 illustrates an example of a memory system with supercell memory devices with individual temperature-dependent biasing circuit per each row.

FIG. 6 illustrates another modified version of the system architecture shown in FIG. 3 where the sources of memory devices on two adjacent rows of the memory array are joined together (601) reducing the total number of source-lines by half. Each of memory devices sharing sources may form a structure called supercell. Using supercell memory devices to form the memory array may result in memory arrays with higher densities. The erase gates of memory devices forming supercells may also be shared (602). The functionality of memory devices and memory architecture may remain intact by replacing every two neighboring memory devices with a supercell structure.

Figure 7:
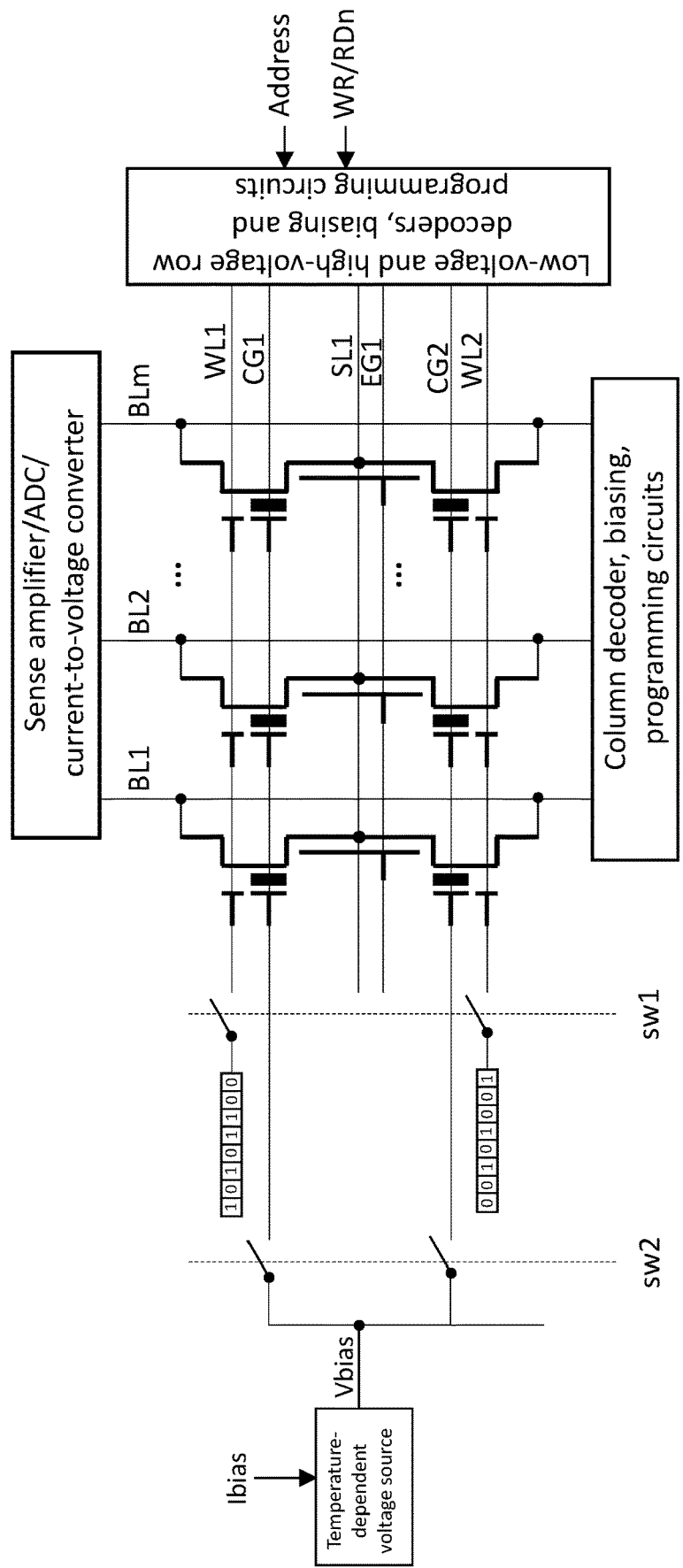
FIG. 7 illustrates an example of a memory system with supercell memory devices with a temperature-dependent biasing circuit shared between multiple rows.

FIG. 7 illustrates another modified version of the system architecture shown in FIG. 4 where the memory array may be implemented using supercell memory devices as explained in the system of FIG. 6.

Figure 8:
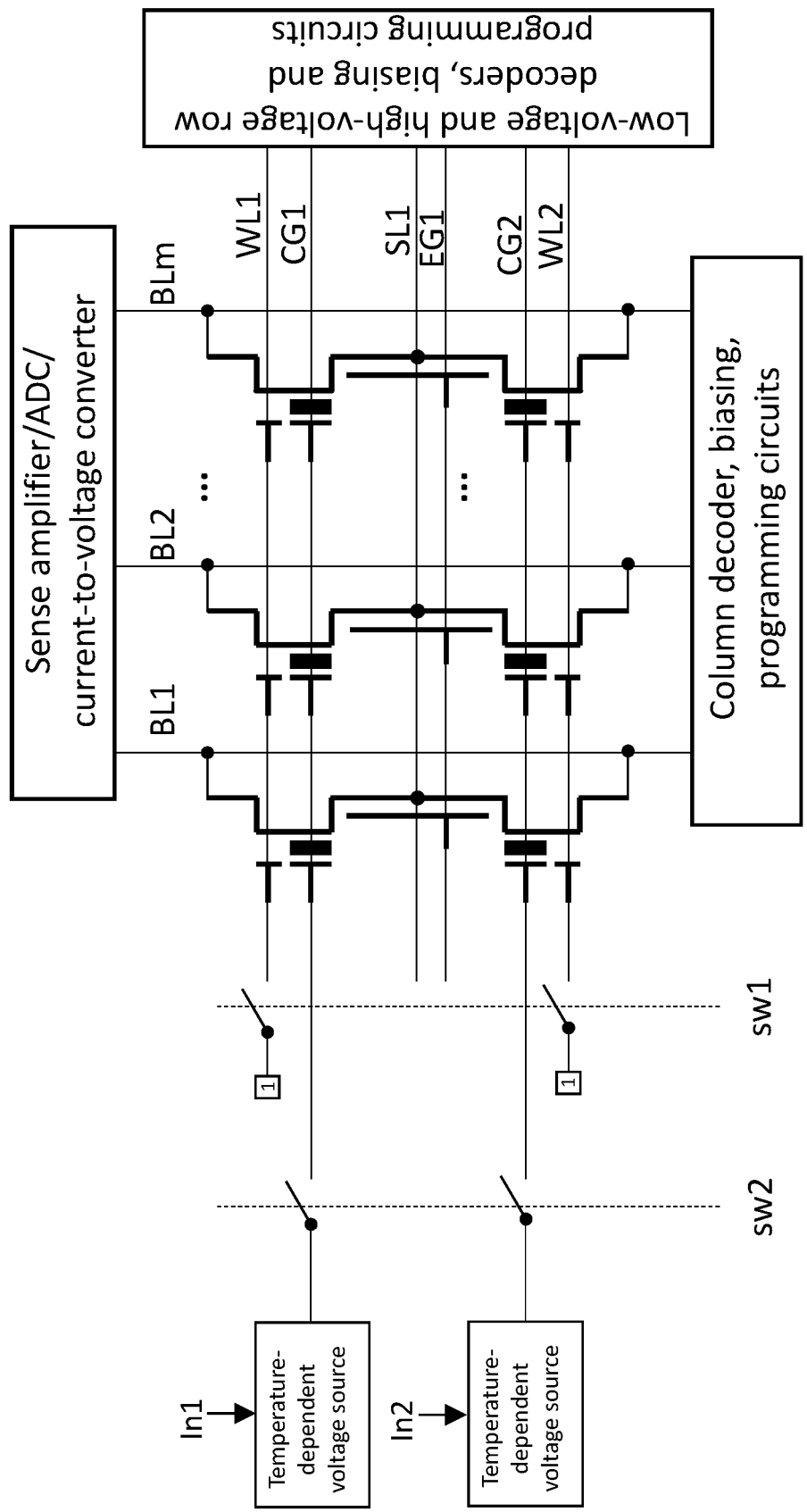
FIG. 8 illustrates an example of a memory system with supercell memory devices for in-memory computing application with input vectors applied to the temperature-dependent biasing circuits biasing memory cells within the memory array.

FIG. 8 illustrates another modified version of the system architecture shown in FIG. 5 where the memory array may be implemented using supercell memory devices as explained in the system of FIG. 6.

Figure 9:
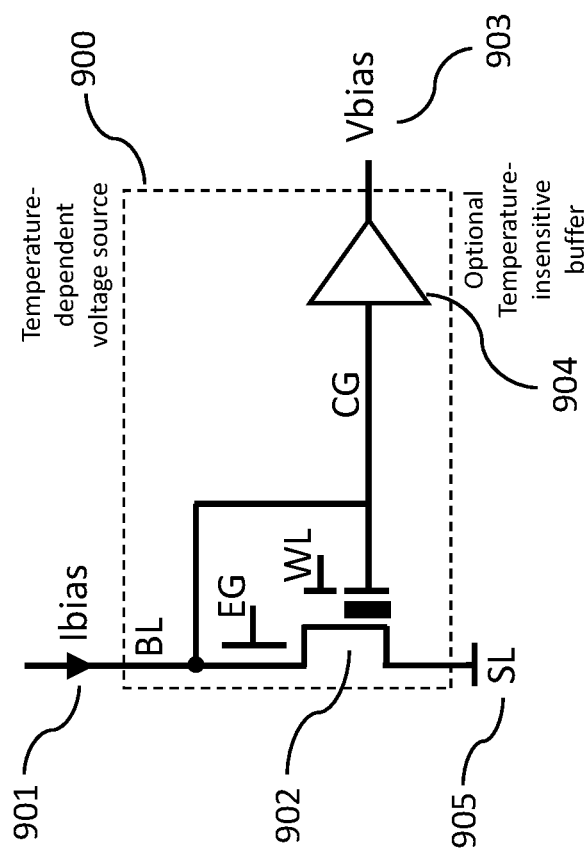
FIG. 9 illustrates an implementation example of temperature-dependent biasing circuits using flash transistors.

FIG. 9 illustrates an example of the voltage-dependent biasing circuit 900 implemented using a flash transistor 902. The flash transistor 902 may be the same type of device as used in memory array. The flash transistor 902 may have a diode-connected configuration implemented by connecting the control gate to bitline directly or indirectly (e.g. with a switch). The diode-connected circuit may receive an input current signal Ibias 901 and convert it to voltage Vbias 903 on the control gate terminal. Main gates, erase gates and source-lines of the flash transistor used to implement the voltage-dependent biasing circuit may be biased with the same voltages as used for the memory devices within the memory array to keep their biasing conditions as close as possible. The voltage applied to the main gate should be such a way that it keeps the flash transistor 902 enabled all the time.

In some embodiment, the voltage-dependent biasing circuit may include a buffer 904 to increasing the driving capability of the voltage generated on the control gate when connected to row(s) of the main memory array. Since the same generated voltages on control gates of 900 may be used to program memory devices inside the memory array, the buffer 904 may be designed with low accuracy to save power and chip area.

In some embodiments, the flash transistor 902 may be replaced by a set of flash transistors connected in parallel to reduce the mismatch between the behavior of the transistor 902 and the flash transistors within the main memory array. In this case, the input Ibias current 901 may be scaled by the number of flash transistors connected in parallel.

Main gate and control gate may be used interchangeably. When control gate has more overlap with the floating gate and is closer to the source-line, using control gate to generate voltage may be preferred.

Flash transistor or a set of flash transistors connected in parallel used to implement the system 900 may be separate and isolated transistors or may be a part of the main memory array (e.g. one column or one row of the memory array) configured to the structure shown in FIG. 9 using switches and wire routings to reduce chip area.

There may be a programming and biasing peripheral circuitry (not shown in FIG. 9) for programming the flash transistor(s) 902 and to bias the transistor(s) with proper voltages and currents during the read, write or operation phases.

Better temperature effect compensation may be achieved if the flash transistor(s) 902 is programmed to the state similar to the states of memory devices within the memory array and is biased with conditions similar to what flash transistors in the memory array are biased to. More complicated circuits may be used to force a fixed voltage on the drain of the flash transistor 902 to reduce the sensitivity of the whole memory system to temperature even more.

In some embodiments, the flash transistor 902 may be replaced with a regular CMOS transistor to convert the input current to voltage. The sizing and the characteristics of the regular transistor may be adjusted to make the behavior of the regular transistor as similar as possible to the behavior of flash transistors to increase the effectiveness of the implemented temperature compensation scheme.

Figure 10:
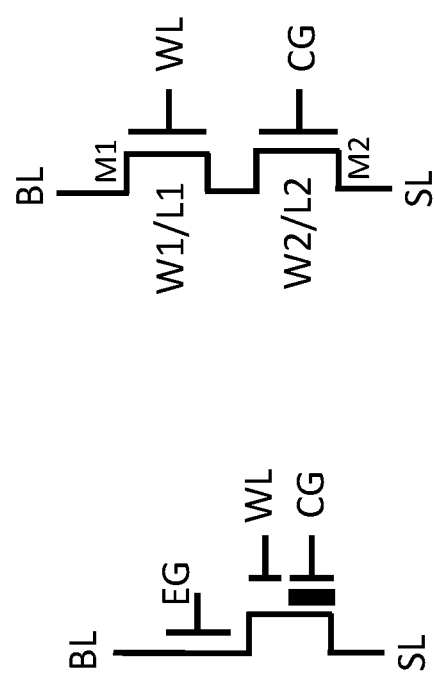
FIG. 10 illustrates an example of replacing flash transistor with two regular CMOS transistors.

FIG. 10 illustrates how the serial connection of two regular transistors M1 and M2 may be used to replace the flash transistor with 2 controlling gates. A gate closer to the source may be called CG (i.e. gate of transistor M2) and the gate closer to drain may be called WL (i.e. gate of transistor M1). Transistors M1 and M2 may be sized differently to deliver specific behavior and to reduce the impact of WL on the behavior of the combined transistor (to reduce its functionality to a simple switch).

In some embodiments, the flash transistors of the memory array may be replaced by a 1T-1R memory structure. In these cases, the gate of the transistor in series with the resistive element may be biased with the temperature-dependent biasing circuit to reduce the sensitivity of the memory module to temperature.

In accordance with common practice, the various features illustrated in the drawings may not be drawn to scale. The illustrations presented in the present disclosure are not meant to be actual views of any particular apparatus (e.g., device, system, etc.) or method, but are merely example representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the summary, detailed description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

The foregoing description, for purpose of explanation, has been described with reference to specific embodiments. However, the illustrative discussions above are not intended to be exhaustive or to limit the invention as claimed to the precise forms disclosed. Many modifications and variations are possible in view of the above teachings. The embodiments were chosen and described to explain practical applications, to thereby enable others skilled in the art to utilize the invention as claimed and various embodiments with various modifications as may be suited to the particular use contemplated.

The invention claimed is:

1. A memory system having a temperature effect compensation mechanism, the system comprising:
   a plurality of memory cells organized in an array having two or more rows of memory cells arranged horizontally and two or more columns of memory cells arranged vertically, wherein the plurality of memory cells includes a supercell structure having shared sources and erase gates and has an operating temperature range; and
   a temperature-dependent biasing circuit, wherein the temperature-dependent biasing circuit is configured to:
      reduce a biasing voltage to the plurality of memory cells in response to the temperature of the array being at or near an upper end of the operating temperature range; and
      increase the biasing voltage to the plurality of memory cells in response to the temperature of the array being at or near a lower end of the operating temperature range.

2. The memory system of claim 1, wherein each row of memory cells within the array has a separate temperature-dependent biasing circuit that controls the biasing voltage for each memory cell within the row.

3. The memory system of claim 2, wherein the memory system is used for in-memory applications and inputs are applied directly to the temperature-dependent biasing circuit.

4. The memory system of claim 3, wherein each of the two or more rows of memory cells includes a first gate and a second gate, and wherein digital inputs are applied to the first gate and inputs from the temperature-dependent biasing circuit are applied to the second gate.

5. The memory system of claim 3, wherein each of the two or more rows of memory cells includes a first gate and a second gate, and wherein the first gate is used for row selection and the second gate is used for both digital inputs and inputs from the temperature-dependent biasing circuit.

6. The memory system of claim 1, wherein the temperature-dependent biasing circuit controls the biasing voltage for memory cells in a plurality of rows within the array.

7. The memory system of claim 1, wherein each row of the two or more rows of memory cells includes an extra input configured to turn on and off the memory cells during either a read or write operation.

8. The memory system of claim 7, wherein analog or digital inputs are applied to the extra input.

9. The memory system of claim 1, wherein the temperature-dependent biasing circuit converts an analog input current to a temperature-dependent voltage that is used to bias the memory cells within the array.

10. The memory system of claim 9, wherein the memory cells convert the biasing voltage to a current based on an amplitude of the biasing voltage.

11. The memory system of claim 1, wherein the temperature-dependent biasing circuit is a diode connected flash or floating-gate transistor.

12. The memory system of claim 1, wherein the temperature-dependent biasing circuit includes a buffer configured to increase the driving capability of the biasing circuit.

13. The memory system of claim 1, wherein the memory cells are programmable with analog (multi-bit) or digital values.

14. The memory system of claim 1, wherein the memory cells are flash or floating-gate transistors.

15. The memory system of claim 1, wherein the memory cells are configured to be biased to operate at different operating regimes including subthreshold, saturation, or triode (linear).

16. A memory system having a temperature effect compensation mechanism, the system comprising:
 a plurality of memory cells organized in an array having a first row of two or more electrically coupled memory cells arranged horizontally and a second row of two or more electrically coupled memory cells arranged horizontally;
 a first temperature-dependent biasing circuit having a first I-V curve configured to sense a temperature of the memory cells in the first row; and
 a second temperature-dependent biasing circuit having a second I-V curve configured to sense a temperature of the memory cells in the second row,
 wherein the first temperature-dependent biasing circuit is configured to change a biasing voltage applied to the first row of memory cells based on a temperature of the memory cells in the first row and wherein the second temperature-dependent biasing circuit is configured to change a biasing voltage applied to the second row of memory cells based on a temperature of the memory cells in the second row.

17. The memory system of claim 16, wherein:
 the plurality of memory cells has an operating temperature range,
 the first temperature-dependent biasing circuit is configured to reduce the biasing voltage applied to the first row of memory cells when the temperature of the memory cells in the first row is at or near an upper end of the operating temperature range and increase the biasing voltage applied to the first row of memory cells when the temperature of the memory cells in the first row is at or near a lower end of the operating temperature range, and
 the second temperature-dependent biasing circuit is configured to reduce the biasing voltage applied to the second row of memory cells when the temperature of the memory cells in the second row is at or near an upper end of the operating temperature range and increase the biasing voltage applied to the second row of memory cells when the temperature of the memory cells in the second row is at or near a lower end of the operating temperature range.

18. The memory system of claim 16, wherein the first row of two or more electrically coupled memory cells includes an extra input configured to turn on and off the memory cells in the first row during either a read or write operation.

19. The memory system of claim 16, wherein analog or digital inputs are applied to the extra input.

* * * * *